United States Patent [19]

Butler et al.

[11] 4,145,689
[45] Mar. 20, 1979

[54] A/D CONVERTER

[75] Inventors: Walter J. Butler; Charles M. Puckette, both of Scotia, N.Y.

[73] Assignee: General Electric Company, Schenectady, N.Y.

[21] Appl. No.: 853,115

[22] Filed: Nov. 21, 1977

Related U.S. Application Data

[63] Continuation of Ser. No. 628,542, Nov. 3, 1975, abandoned.

[51] Int. Cl.² ............................................. H03K 13/20
[52] U.S. Cl. ......................... 340/347 AD; 340/347 NT
[58] Field of Search ................. 340/347 AD, 347 NT; 324/111

[56] References Cited

U.S. PATENT DOCUMENTS 3,414,807 12/1968 Evans .................................. 324/111
3,439,272 4/1969 Bailey .................................. 324/111

Primary Examiner—Charles D. Miller
Attorney, Agent, or Firm—Geoffrey H. Krauss; Joseph T. Cohen; Marvin Snyder

[57] ABSTRACT

An analog-to-digital converter is described wherein an analog signal is converted to a digital equivalent thereof in a structure suitable for implementation in MOS form. The analog signal is converted to a quantity of charge which is duplicated by summing a plurality of substantially equal sized charge packets in an MOS charge storage location.

2 Claims, 13 Drawing Figures

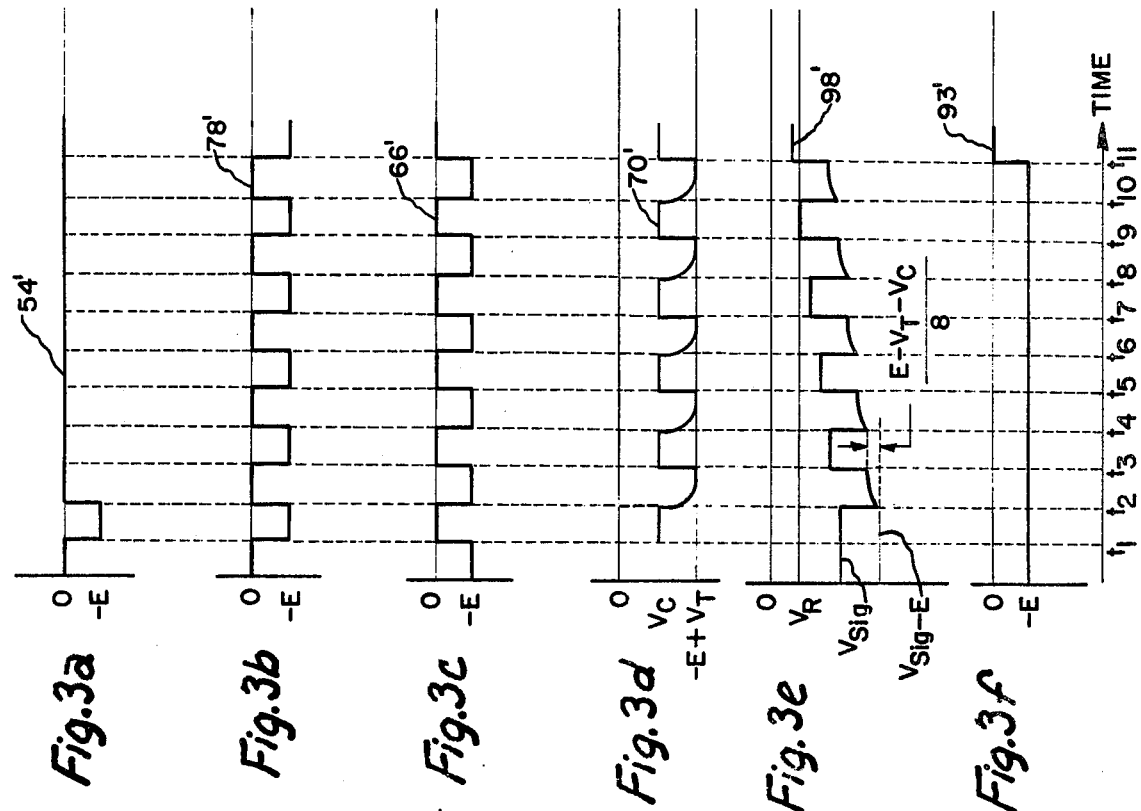
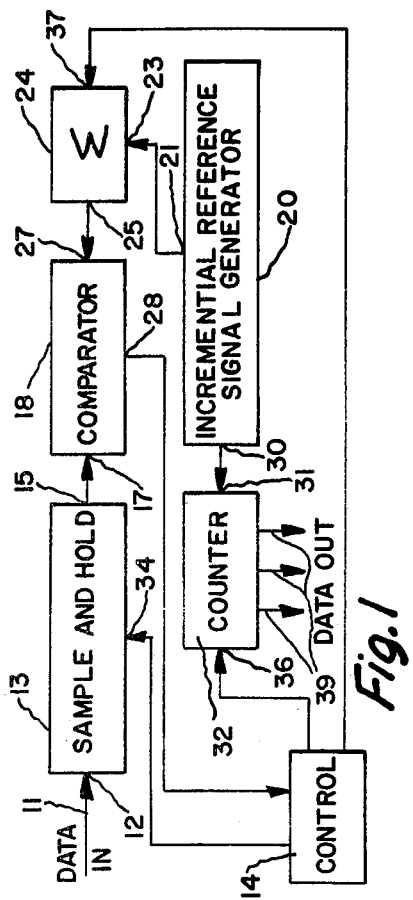
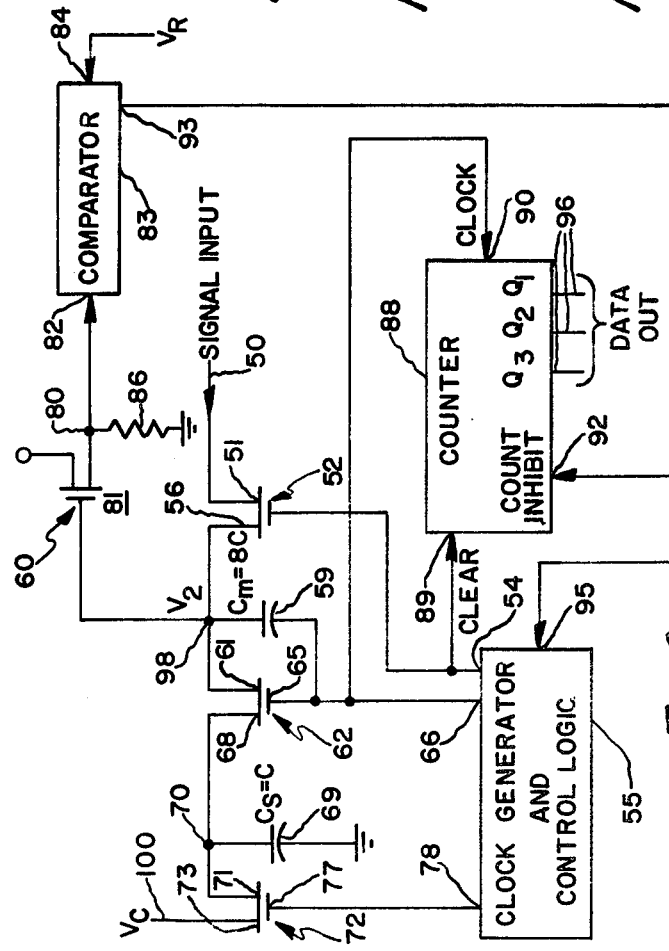

A/D CONVERTER

This is a continuation of application Ser. No. 628,542 filed Nov. 3, 1975, now abandoned.

This invention relates in general to analog to digital converters and more particularly to such converters wherein a counting conversion technique is employed.

The conversion of analog signals to their digital equivalents has long been a desirable function, and to that end a number of analog to digital (A/D) converters have been available. Prior art A/D converters may be categorized generally into a relatively small number of easily identifiable types. Included among these are, for example, counting A/D converters wherein the voltage to be converted is first converted to a frequency which frequency may then be counted by well-known techniques, and successive approximation converters wherein the voltage to be converted is duplicated by a process wherein successively smaller increments of voltage are added. The successive approximation technique may also be implemented in converters wherein the voltage increments are created by resistive or capacitive voltage dividers. Yet another technique utilizes a digital to analog converter, the digital signal required to produce an analog voltage equal to the voltage being measured providing the digital output of the converter. Still another type of A/D converter, the integrating type, employs electronic operational amplifiers for integrating up to a preselected reference level at a rate proportional to the unknown voltage and then down to a zero reference level at a rate proportional to a fixed reference level thereby providing a measure of the unknown voltage.

Recently, advances in microelectronics and the processing techniques associated therewith have made possible extremely small and inexpensive microcomputers oftentimes implemented on a single or small number of integrated circuit chips. It is expected that these semiconductor devices, either computers or microprocessors, will have a rapidly expanding number of uses, for example but not limited to: machine control, automobile and other transportation control and instrumentation, appliance control and a wide variety of uses (some not yet even conceived) which will require in many cases transducers for providing inputs to these devices in usable digital form. It will be appreciated therefore that there is a need for low-cost, highly accurate analog to digital converters compatible with microelectronic computers and microprocessors. Accordingly, it is an object of this invention to provide a new and improved method and apparatus for converting an analog signal to its digital equivalent which will be fully compatible with the most advance known microelectronic computer and microprocessing technology. An analog to digital converter in accordance with this invention may be easily implemented in charge transfer or surface charge transfer technologies and may therefore be readily implemented on a single chip along with the device which will utilize its outputs. An analog to digital converter in accordance with this invention may be readily implemented in a structure substantially simpler than many of the prior art analog to digital converters herein-above described. Consequently, low initial cost and high reliability are features of this invention. Further, an analog to digital converter in accordance with this invention does not require the high degree of manufacturing precision and component precision required in a number of those prior art analog to digital converters described supra in order to achieve equal or greater accuracy. This invention provides, for the first time a new analog-to-digital converter which may be implemented in monolithic form in metal-oxide-semiconductor (MOS) technology without the need for difficult to fabricate linear components.

Briefly stated and in accordance with one aspect of this invention, an analog to digital converter includes means for sampling an analog signal and for storing a signal proportional to the value thereof, in combination with a generator for generating a plurality of incremental reference signals having substantially constant amplitude and with means for storing these reference signals so that a constantly increasing signal is produced. A counter associated with the incremental reference signal generator continuously monitors the number of reference signals supplied to a summer and a comparator continuously compares the ever-increasing value of the signal stored in the summer with the previously established signal proportional to the input voltage and controls the counter so that when the internally-generated signal equals the signal proportional to the input voltage, the counter is stopped and the output thereof is the digital equivalent of the input voltage.

While this invention may be implemented in a number of fashions, two specific structures are described herein for achieving the desired function. A first structure includes a capacitive charge storage location for creating a charge deficit and then for summing a large plurality of substantially equal size charge packets therein, and a second structure includes a surface charge storage location wherein charge is removed from a preselected reference amount of charge and thereafter charge is transferred into the charge storage location until the preselected charge level is again reached. In both cases, control and counter circuits along with the comparator are operative to complete the function thereof.

The novel features believed to be characteristic of the present invention are set forth in the appended claims. The invention itself, together with further objectives and advantages thereof, may best be understood with reference to the following detailed description, taken in connection with the appended drawings in which:

FIG. 1 is the block diagram of an analog to digital converter in accordance with one aspect of this invention;

FIG. 2 is a partial schematic diagram of one embodiment of this invention;

FIGS. 3a–3b are waveform diagrams of several of the waveforms occurring in the embodiment of this invention illustrated in FIG. 2;

Figure 4:
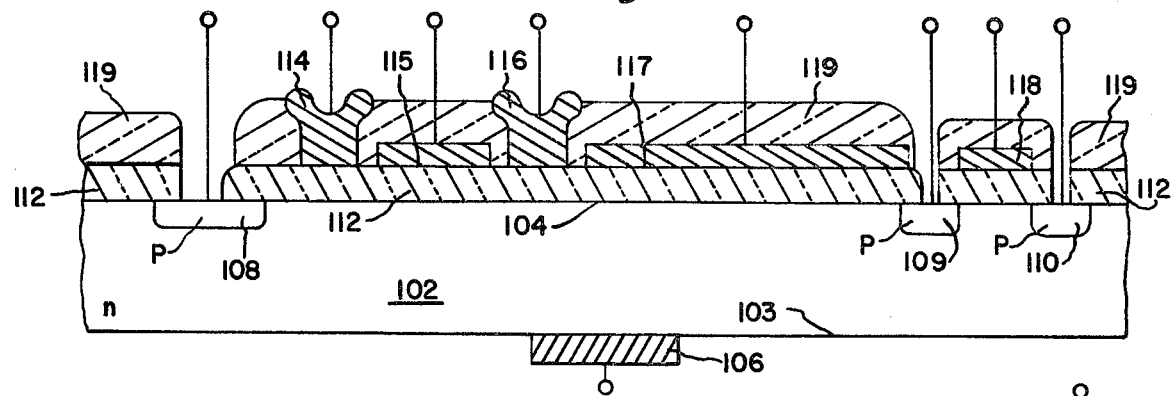
FIG. 4 is a sectional view of a surface charge transfer structure.

A block diagram illustrating the functions of an analog to digital converter in accordance with this invention and the cooperation and interaction therebetween is illustrated at FIG. 1. An analog input signal is applied to input terminal 11 which is in turn connected to the input 12 of a sample and hold circuit 13 which is operative under the control of control circuit 14 to sample the value of the analog input signal at a particular instant in time and to store that value so that it may usefully be employed during the analog to digital conversion cycle.

Many types of sample and hold circuits are known to those skilled in the art and it is not required in accordance with this invention that any particular type be employed. Preferably, a sample and hold circuit for use in accordance with this invention will have a sufficiently fast response time that a sample of the input analog signal may be taken which truly reflects the instantaneous value of the analog input signal at a particular time. Output 15 of sample and hold circuit 13 is connected to input 17 of comparator 18. A signal is supplied from sample and hold circuit 13 to comparator 18 which is representative of the sampled value of the analog input signal. It is to be understood that the particular sample and hold circuit 13 employed in accordance with this invention will determine the relationship between the voltage appearing at output 15 thereof to the input analog voltage. All that is required in accordance with this invention is that the relationship be well-defined so that the value of the voltage appearing at output 15 of sample and hold circuit 13 be sufficient to determine the input voltage appearing at input terminal 11 of the analog to digital converter.

Incremental reference signal generator 20 provides, at output 21 thereof, a continuous stream of constant amplitude reference signals. The precise nature of the reference signals supplied by signal generator 20 depends upon the characteristics which it is desired that the analog to digital converter possess. It is preferred that, at the lowest input voltage expected to be applied to input terminal 11, the number of incremental reference signals which when summed equal the voltage appearing at output 15 of sample and hold circuit 13 be large. The greater the number of incremental reference signals which when summed equal the output of sample and hold circuit 13, the greater the resolution of an analog to digital converter in accordance with this invention. Output 21 of signal generator 20 is connected to input 23 of summing circuit 24. Summing circuit 24 is operative to receive the incremental reference signals from signal generator 20 and to sum those signals during the measurement cycle to provide at output 25 thereof a signal which continuously increases by substantially identical quantities during the measurement cycle. Output 25 of summing circuit 24 is connected to input 27 of comparator 18. It is important to note that output 25 of summer 24 does not provide a signal which, as have prior art analog to digital converters, successively approximates the analog voltage being measured. Rather, a voltage appears at output 25 of summer 24 which is a step-wise monotonically increasing voltage, the steps of which are maintained at the same incremental level throughout the measurement cycle. Comparator 18 receives a first signal from the output of sample and hold circuit 13 and a second signal from summing circuit 24. The output 28 of comparator 18 is a bilevel output having a first level when input 27 is less than input 17 and a second level when input 27 is equal to or greater than input 17. It will be appreciated therefore that so long as the ever-increasing output of summing circuit 24 is less than the output of sample and hold circuit 13 comparator 18 has an output at a first or a zero state. As soon as the output of summing circuit 24 equals the output of sample and hold circuit 13, comparator 18 senses this and its output switches to a second state. Output 28 of comparator 18 is applied to control circuit 14. It will be appreciated that inputs 17 and 27 to comparator 18 need not be at the actual signal level being measured so long as the relationship between these levels and the actual voltage being measured is known. A second output 30 of incremental reference signal generator 20 is connected to input 31 of counter 32. Counter 32 is operative during the measurement cycle to continuously count the number of incremental reference signals applied to summing circuit 24. As will be discussed in more detail hereinbelow, incremental reference signal generator 20 may, if desired, run continuously, suitable control being exercised by control circuit 14.

The operation of control circuit 14 may be most easily understood by considering an exemplary measurement cycle of an analog to digital converter in accordance with this invention. Assume that an analog signal is continuously being applied to input terminal 11 and further assume that the measurement cycle to be described occurs during a time period that is short compared to the period of the highest frequency component present in the input analog signal. As the measurement cycle is initiated, a signal is applied from control circuit 14 to input 34 of sample and hold circuit 13. The input analog signal is sampled at this time and an output representative of the value at the time of sampling is applied to input 17 of comparator 18 where it is maintained throughout the measurement cycle. At the same time control circuit 14 applies a set or reset signal to input 36 of counter 32. It will be appreciated that although one connection is shown between control circuit 14 and counter 32 that a number of functions hereinbelow described are intended to be included in the single illustrated connection. The set or reset signal applied to counter 32 clears any previous count and sets the counter to zero. Similarly, control circuit 14 applies a reset signal to input 37 of summing circuit 24 which reset signal removes any previously summed signals from summing circuit 24. The analog to digital converter is now in condition to begin a conversion cycle. Incremental reference signal generator 20 may either run continuously or, if desired, be started and stopped in accordance with the measurement cycles. It is a feature and advantage of this invention that it is not time-dependent as is the case with many prior art types of analog to digital converters but rather is dependent only on the number and size of the incremental reference signals summed by summing circuit 24. It may be seen therefore that incremental reference signal generator 20 need not provide incremental reference signals at a rate which is linear with respect to time. It will be appreciated that so long as the summing circuit and sample and hold circuit maintain the signals stored therein independent of time, that the conversion process may take a substantially arbitrary length of time to complete. After the initial conditions have been established as described hereinabove, signals applied to input 23 of summing circuit 24 begin to accumulate therein and output 25 begins to increase in a step-wise and linear fashion. It is important in accordance with this invention that summing circuit 24 produce an output at output terminal 25 thereof which is linear with respect to the input applied to input 23. The output appearing at output 25 of summing circuit 24 which is applied to input 27 of comparator 18 may be visualized as a staircase-type signal wherein the increase in signal level at each transition is equal to all other increases. As each incremental reference signal is applied to input 23 of summing circuit 24 a counting signal is applied to input 31 of counter 32. It will be understood by one skilled in the art that these counting signals may take a variety of forms including but not limited to a sample of the incremental reference signal itself, or a pulse which occurs at the leading or trailing edge of each incremental reference signal or any other signal which occurs each time an incremental reference signal is applied to summing circuit 24. Counter 32 continues to count incremental reference signals during the measurement cycle until the signal level applied to input 27 of comparator 18 equals the signal level applied to input 17 thereof. At this point output 28 of comparator 18 changes state as was hereinabove described and a signal is applied to control circuit 14. Control circuit 14 applies a stop signal to counter 32 and a count which is indicative of the number of incremental reference signals applied to summing circuit 24 is available at output 39 of counter 32. Output 39 may take any convenient form as, for example serial or parallel data output forms as required by the particular application in which this invention is employed. Counter 32 will preferably employ means for storing the value of the final count of incremental reference signals for so long as the count is required or until the succeeding measurement interval begins. Counter 32 is not time-dependent. It may be considered as an events counter rather than a frequency counter and the time between events is irrelevant to the count obtained. After the count appearing at output 39 of counter 32 is appropriately utilized a new conversion cycle may be initiated by resetting counter 32, summing circuit 24 and sample and hold circuit 13 as was hereinabove described.

The analog to digital converter of FIG. 1 and the description given in accordance therewith have illustrated an exemplary embodiment of this invention. It will be understood by one skilled in the art that certain modifications may be made therein without departing from the true spirit and scope of the invention. For example, where the signal to be converted is a DC signal, the need for sample and hold circuit 13 is obviated and the signal may be applied either directly or through appropriate scaling or signal conditioning means to input 17 of comparator 18. Further, while incremental reference signal generator 20 has been described as providing a signal to summing circuit 24 which will produce a step-wise increasing signal at output 25 thereof, it is to be understood that so long as the incremental size of the signal produced at output 25 of summing circuit 24 is constant, that no particular requirement is imposed upon the exact waveshape of the incremental reference signals. For example, a wide variety of square waves, rectangular waves, pulses, triangular waves, half sine waves, or the like, may be suitably employed. As was hereinbefore described, no particular time relationship between the successive incremental signals is imposed by this invention. Incremental reference signal generator 20 does not provide a ramp signal of the type hereinbefore employed in time-dependent integrating A to D converters.

An exemplary embodiment of an analog-to-digital converter in accordance with this invention is illustrated in partial block diagram, partial schematic form at FIG. 2. Waveforms which illustrate an exemplary mode of operation for the analog-to-digital converter of FIG. 2 are depicted at FIG. 3. The embodiment of this invention illustrated at FIG. 2 is particularly well suited for implementation in accordance with standard MOS integrated circuit technology as used, for example, in bucket brigade delay lines.

A single input 50 is connected to a first terminal 51 of transistor switch 52, the gate terminal of which is connected to first output 54 of generator and logic module 55. Output terminal 56 of transistor switch 52 is connected to node 98. Node 98 is connected to first capacitor 59, the gate of isolating transistor 60 and terminal 61 of switching transistor 62. Capacitor 59 is also connected to gate terminal 65 of switching transistor 62 which gate terminal is also connected to output 66 of generator and logic module 55. Terminal 68 of switching transistor 62 is connected to one end of capacitor 69, the other end of which is connected to ground. The ungrounded end of capacitor 69 is also connected to terminal 71 of switching transistor 72, terminal 73 of which is connected to input terminal 100 which is adapted to be connected to a source of bias voltage. Gate terminal 77 of switching transistor 72 is connected to output terminal 78 of generator and logic module 55. Output terminal 80 of source follower 81, which includes transistor 60, is connected to input 82 of comparator 83. A second input 84 of comparator 83 is adapted to be connected to a reference voltage source. Source follower 81 also includes resistor 86. The analog-to-digital converter of FIG. 2 also includes a counter 88. Counter 88 includes inputs 89 and 90 which are connected to outputs 54 and 66, respectively, of generator and logic circuit 55. Counter 88 further includes input 92 which is connected to output 93 of comparator 83 which is also connected to input 95 of generator and logic circuit 55. Counter 88 also includes output 96 which may include one or more actual output terminals for the parallel or serial presentation of output data thereat substantially as described hereinabove in conjunction with FIG. 1.

It will be appreciated that the circuit of FIG. 2 may readily be implemented either in discrete form with standard resistors, capacitors, and transistors or in monolithic metal-oxide-semiconductor (MOS) technology as is well known. All of the elements of FIG. 2 including the elements illustrated in block form may be readily constructed on a single integrated circuit wafer and on an exceptionally small area thereof. It will be apparent to one skilled in the art, therefore, that a complete analog-to-digital converter in accordance with this invention may be readily constructed on a single integrated circuit wafer utilizing well known state of the art fabrication techniques.

The operation of the analog-to-digital converter of FIG. 2 may be readily understood by reference thereto and also to the waveform diagrams of FIG. 3 which illustrate the voltages present at a number of points in the circuit diagram of FIG. 2. It is emphasized that the waveforms illustrated at FIG. 3 are exemplary only and that the precise magnitude and timing of the waveforms employed in an actual embodiment of this invention might very somewhat from those illustrated depending upon the purpose for which the analog-to-digital converter was to be employed and upon the specific nature and values of the elements employed to implement it. Accordingly, except as specifically indicated, no actual voltages are given at FIG. 3. Also omitted from FIG. 3 are any particular time base references. The waveform diagrams of FIG. 3 are intended to illustrate the relationships among the various waveforms rather than any particular time base. it is to be understood that as was hereinabove described, the operation of the analog-to-digital converter of this invention is substantially independent of time and that, subject to limitations of the fabrication technology employed, the time base of the converter may vary widely from rather low frequencies in the kilohertz range to extremely high frequencies, on the order of 1 to 10 megahertz. Even these high frequency limitations are to be understood to be limitations based upon the present state of the fabrication arts and not upon any limitations inherent in this invention.

The waveform diagrams of FIG. 3 are designated serially as 3a through 3f and represent, respectively, the voltage appearing at generator and logic circuit output terminals 54, 78 and 66 and the voltages appearing at the ungrounded end of capacitor 69 and the end of capacitor 59 which is connected to terminal 61 of switching transistor 62 and also to transistors 52 and 60. FIG. 3f is representative of the voltage appearing at output 93 of comparator 83.

In operation, a single input is applied to input terminal 50 which is connected to terminal 51 of switching transistor 52. The gate of transistor 52 is connected to output 54 of generator and logic circuit 55 and a voltage as represented by FIG. 3a is applied to the gate. It will be appreciated that either p-channel or n-channel transistor switches may readily be employed and for purposes of illustration only, it will be assumed that in this embodiment transistor 52 is a p-channel transmission switch and therefore that a negative voltage will cause it to turn on. The waveform illustrated at FIG. 3a varies between 2 voltage levels, zero volts and −E volts where E is a more or less arbitrary voltage depending upon the particular switching transistor employed and may, by way of example, be equal to approximately −10 or −15 volts. During the time that transistor 52 is turned on, that is to say during the time that the waveform of FIG. 3a is at the −E level, the signal input applied to input terminal 50 is connected to node 98. At the same time that transistor 52 is turned on, the voltage appearing at output terminal 66 of generator and control circuit 55 is zero volts and transistor 62 is turned off and the end of capacitor 59 which is connected to output 66 is at ground potential. It will be seen that the signal voltage appearing at input 50 appears across capacitor 59, which will therefore be charged to that voltage. At the same time that capacitor 59 is charged to the input voltage, transistor 72 is turned on as the voltage appearing at output terminal 78 goes to a negative value, and a control voltage applied to input terminal 100 is connected through transistor 72 to capacitor 69 which charges to that voltage. The control voltage applied to terminal 100 is preferably selected to fall between the gate voltage utilized to control transistors 62 minus the threshold voltage of the device and zero volts. As will be described hereinbelow, the voltage connected to terminal 100 along with the ratio of the capacitances of capacitors 69 and 59 will determine the rate at which analog data may be converted to digital data along with the resolution of the conversion process itself. FIG. 3d illustrates the voltage appearing across capacitor 69. It will be appreciated that during the time that transistor 72 is turned on that this voltage is constant and equal to the voltage applied to input 100.

Assuming now that both capacitor 69 and capacitor 59 are appropriately precharged with the control voltage and signal voltage sample, respectively, the conversion process begins. Referring to FIG. 3a, it will be seen that once an input signal sample is placed on capacitor 59, transistor 52 is turned off as the voltage appearing at output 54 rises to zero volts and remains off through the conversion cycle. Further, connection is made from output terminal 54 to input 89 of counter 88. The pulse which stores the signal sample on capacitor 59 also resets counter 88 to its zero condition. By way of review, it is pointed out that the initial conditions at the beginning of a counting cycle are as follows: capacitor 69 is charged to a voltage equal to the voltage applied to input terminal 100 as shown in FIG. 3d and capacitor 59 is charged to a voltage equal to the voltage applied to input 50 as shown in FIG. 3e. At the beginning of the first cycle of the conversion process, the output of terminal 78 shifts from −E volts to zero volts and transistor 72 is turned off, output 66 shifts from zero volts to −E volts and transistor 62 is turned on and output 54 shifts from −E volts to zero volts turning transistor 52 off. Since one end of capacitor 59 is connected to output 66 and since this output instantaneously changes from zero volts to −E volts, the voltage appearing at node 98 will also change by an amount equal to E volts. Capacitors 59 and 69 are connected together through transistor 62 and charge will flow from one to the other in a direction to equalize the voltages thereacross. Referring to FIGS. 3d and 3e, it will be noted that since the voltage appearing at node 98 is lower than the voltage appearing across capacitor 69 charge will flow from capacitor 59 to capacitor 69 and the voltage across capacitor 69 will decrease as is shown at FIG. 3e. Similarly, the voltage appearing at node 98 will increase by an amount proportional to the ratio of capacitances between capacitor 69 and 59. For example, referring to FIG. 3e where the ratio is, for example, 8:1, the voltage appearing at node 98 will initially decrease by an amount equal to −E volts as shown and then will increase by an amount $E - V_t - V_c$ where E is the clock voltage, $V_t$ is the threshold voltage of transistor 62 and $V_c$ is the voltage applied to input 100. Referring again to FIG. 3d, it will be noted that when the voltage across capacitor 69 decreases to $-E + V_t$, transistor 62 will turn off and no further charge will be transferred from capacitor 59 to capacitor 69. The voltage across capacitor 69 will remain constant until transistor 72 is again turned on at which time it will rise to $V_c$ where it will remain until the next cycle of the conversion occurs. At the same time that the hereinabove described charge transfer takes place, output 66 also supplies an input to input terminal 90 of counter 88 which advances the count one unit. It will be appreciated therefore that counter 88 continuously counts thhe number of charge transfers occurring from capacitor 59 to capacitor 69. After sufficient time has elapsed for a substantially complete charge transfer to occur, the voltages at outputs 78 and 66 change state, as shown at FIGS. 3b and 3c, the voltage at output 78 changing from zero volts to −E volts and the voltage at output 66 changing from −E volts to zero volts. With these voltages supplied to transistors 72 and 62, transistor 72 turns on and capacitor 69 again charges to $V_c$ volts while capacitor 59 is isolated therefrom and additionally capacitor 59 is raised in voltage by an amount equal to E volts which in turn raises the voltage at node 98 by E volts. The voltage at node 98 is sensed by source follower 81 and applied to input 82 of comparator 83. If this voltage is less than the reference voltage applied to input 84 of comparator 83, no change will occur in the voltage at output 93 thereof and no signal will be applied to counter 88 or to generator and logic circuit 55. If, however, the voltage appearing at node 98 is sufficient that the voltage applied by source follower 81 to input 82 of comparator 83 is equal to or exceeds the reference voltage applied to terminal 84 thereof, comparator 83 will apply a signal from output 93 thereof to input 92 of counter 88 and also to input 95 of generator and logic circuit 55. The input to counter 88 will inhibit further counting and store the highest previously registered count therein which will then be applied to outputs 96 thereof. Further, generator and logic circuit 55 will hold the voltages at outputs 78, 66 and 54 thereof at zero volts thus stopping the conversion cycle. Assuming, however, as was illustrated at FIG. 3e, the voltage at node 98 is insufficient to cause the comparator to shift state a second cycle of the conversion process occurs. At the onset of the second cycle it will be observed by reference to FIG. 3 that output 54 is at zero volts, output 66 is at zero volts and output 78 is at $-E$ volts. Accordingly, transistor 52 is turned off as is transistor 62 while transistor 72 is turned on and capacitor 69 is charged therefore to the voltage appearing at terminal 100. It will be recalled that since during the first cycle of the conversion process, the voltage across capacitor 59 was reduced from $-V_s-E$ by an amount equal to $(E-V_t-V_c)\div 8$ that the voltage across capacitor 59 at the beginning of the second cycle of the conversion process will be reduced from the signal voltage by an equal amount. This may be readily appreciated with reference especially to FIG. 3e. As the second conversion cycle begins, the voltage at output 78 decreases from $-E$ volts to 0 volts turning off transistor 72, the voltage at output 66 increases from 0 volts to $-E$ volts turning on transistor 62 and a charge transfer process identical to that described hereinabove in conjunction with the first cycle of the conversion process occurs. That is to say, that since the voltage appearing at node 98 is less than the voltage appearing across capacitor 69 charge flows from capacitor 59 to capacitor 69 until the voltage across capacitor 69 is reduced to $-E+V_t$ at which point transistor 62 turns off. It will be appreciated, that after the charge transfer has been completed, the voltage at node 98 will have again been reduced by an amount equal to $(E-V_t-V_c)8$. At this point in the conversion cycle outputs 78 and 66 again shift to $-E$ and O, respectively, and comparison is made again between the voltage appearing at the output of source follower 81 and the reference voltage; output 93 of comparator 83 determining whether or not the conversion cycle is complete as was hereinabove described.

It is to be appreciated by those skilled in the art that the operation of the analog-to-digital converter of FIG. 2 differs somewhat from the structure illustrated at FIG. 1. For example, the structure of FIG. 1 does not require a reference signal voltage to be applied to comparator 18 thereof while the structure of FIG. 2 includes a reference voltage applied to terminal 84 of comparator 83. It will be appreciated that the embodiment of this invention illustrated at FIG. 2 may equally well be operated in the fashion described in conjunction with FIG. 1. For example, reference voltage $V_R$ may be eliminated and the input signal applied to terminal 84 through an appropriate sample and hold circuit if required by the nature of the input signal waveform, and a reference signal, which in each instance is lower than the input signal to be measured, applied to terminal 50 to preset the charge on capacitor 59 to a preselected value. In this way, the amount of charge needed to change the present charge level on capacitor 59 to a level equivalent to the signal voltage to be converted is counted by counter 88 and provides an accurate digital indication of a level of the signal voltage. In all other respects, the operation of the circuit of FIG. 2 remains as has been hereinabove described.

It will be seen that at each segment of the conversion cycle a constant amount of charge is transferred from capacitor 59 to capacitor 69. Since the amount of charge initially placed in capacitor 59 is proportional to the signal input level, the number of transfers out of capacitor 59 is proportional to that level and the analog-to-digital conversion is accomplished. It will be apparent to one skilled in the art that modifications and changes may be made to the structure illustrated in FIG. 3 without departing from the true spirit and scope of this invention. For example, as was mentioned above the relationship between the voltage applied to terminal 100 and the sizes of capacitors 69 and 59 determine the resolution of the analog-to-digital converter in accordance with this invention. It will be appreciated that the smaller charge packets removed from capacitor 59 during each cycle of the conversion process, the greater the resolution which will be obtainable. It will further be appreciated, however, that along with this increased resolution will go a requirement for an increased number of transfers to accomplish the conversion. The particular application for which the analog-to-digital converter in accordance with this invention is designed will determine the speed and accuracy requirements required. Further, the particular form of implementation of an analog-to-digital converter in accordance with FIG. 2 will further limit the ratio between the sizes of capacitor 59 and capacitor 69. For example, where MOS bucket-brigade delay line technology is utilized, fabrication limitations prevent making capacitor 69 arbitrarily small, and limitations upon the desired size of the completed wafer similarly prevent capacitor 59 from being made arbitrarily large. It is clear, however, that despite these limitations, in order to obtain an accuracy of, for example, one part in 1000, it is necessary to insure that at as many as 1000 charge packets can be removed from capacitor 59 per measurement cycle, as required.

A surface charge transfer structure for use in accordance with this invention is shown in FIG. 4. FIG. 4 is a sectional view of an exemplary embodiment of a surface charge transfer structure in accordance with this invention which corresponds substantially to the bucket-brigade type structure illustrated at FIG. 2. A semiconductor substrate 102 which may conveniently be made of either p-type or n-type doped semiconductor material but which for purposes of this exemplary embodiment will be assumed to be of n-conductivity type material, is provided having first and second opposing major surfaces 103 and 104. Surface 103 is conveniently provided with electrical contact means 106 which may be formed as is well known to those skilled in the art by a number of methods as, for example, by alloying to a suitable metal. Surface 104 has three regions of p-type conductivity, 108, 109 and 110 therein extending from the surface towards but not meeting surface 103. These p-type regions may be formed in any convenient manner, the device in accordance with this invention being in no way limited to a particular form of construction thereof. Overlying surface 104 is insulating layer 112 which continuously overlies surface 104 except for openings therein to provide contact to p-type regions 108 through 110. Insulating layer 112 may conveniently be formed of silicon dioxide, for example, or in any of the ways well known to one skilled in the art. Overlying insulating layer 112 are surface adjacent metallizations 114 through 118. These metallizations are insulated from one another by second insulating layer 119. As will be appreciated by one skilled in the art, metallizations 114 through 118 may conveniently be aluminum, molybdenum or highly doped polysilicon, for example, which may be deposited and appropriately etched by any method which will produce metallizations substantially of the character shown and described.

Figure 5:
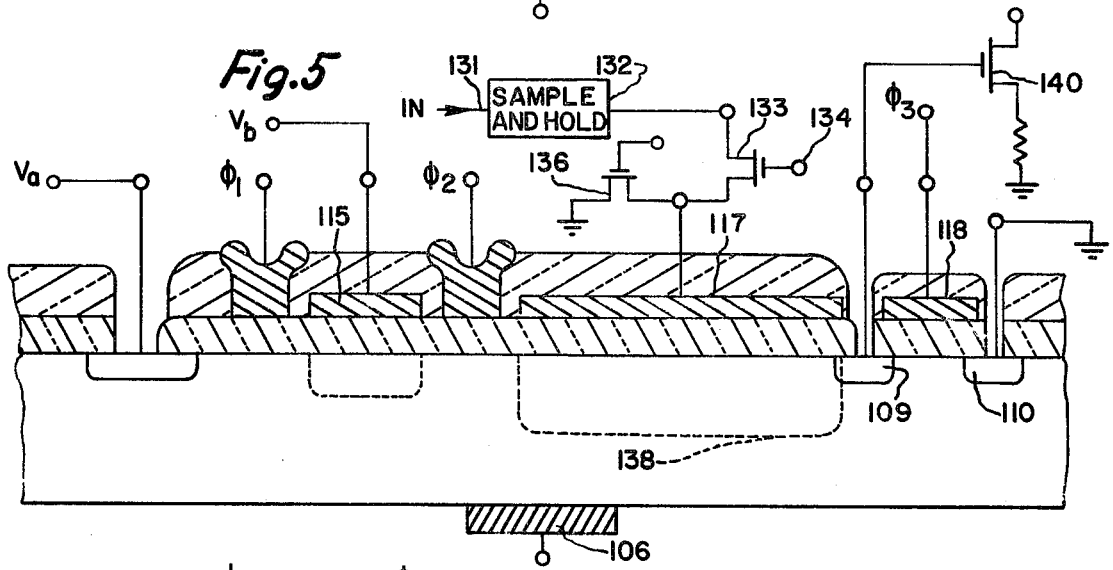
FIG. 5 is a partial schematic diagram of an analog-to-digital converter utilizing the structure of FIG. 4.

There is illustrated at FIG. 5 a partial schematic diagram of an analog-to-digital converter in accordance with this invention utilizing the structure of FIG. 4 hereinabove described. The operation of surface charge transfer devices is well known in the art and the theory in fundamentals thereof will not be discussed in great detail herein. In operation, a first charge storage location 138 is created underlying electrode 117 by application thereto of a voltage proportional to the input voltage applied to terminal 131 of sample and hold circuit 132. The output of sample and hold circuit 132 is applied to electrode 117 through transistor switch 133 whenever terminal 134 thereof is energized. Transistor switch 133 may conveniently be a field effect transistor switch formed on the same semiconductor substrate as the remainder of the analog-to-digital converter. Electrode 117 is also connected through semiconductor switch 136 to ground for removing charge stored in charge storage location 138 between conversions. It will be understood that only one of transistor switches 133 and 136 is energized at any given time, switch 133 being energized during a conversion cycle and switch 136 being energized at the end of a conversion cycle to ready the converter for a subsequent cycle. The conversion process may be readily understood by visualizing the charge storage location underlying electrode 117 as a bucket into which charge packets may be transferred. The depth of the bucket is controlled by the magnitude of the voltage applied to electrode 117. Preferably, during operation the voltage applied to electrode 117 consists of the signal voltage plus an appropriately selected bias voltage. The bias voltage may be supplied as part of sample and hold circuit 132. In addition to grounding electrode 117 during the period between measurement cycles, diffusions 109 and 110 in conjunction with electrode 118 provide for the removal of any surface charge present under electrode 117, prior to the start of a conversion cycle. In operation, diffusion 110 may be connected permanently to ground and a potential applied to electrode 118 lowers the electrical barrier between diffusions 109 and 110 and allows charge to flow to diffusion 110 and thence to ground from charge storage location 138 through floating diffusion 109. In operation, diffusion 109 follows the surface potential in charge storage location 138 and the output of source follower 140 thus provides a signal which is proportional to the amount of charge in charge storage location 138.

Figure 6A:
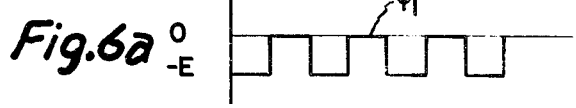
FIGS. 6a–6c illustrate the waveforms occurring in FIG. 5.
Figure 6B:
Figure 6C:
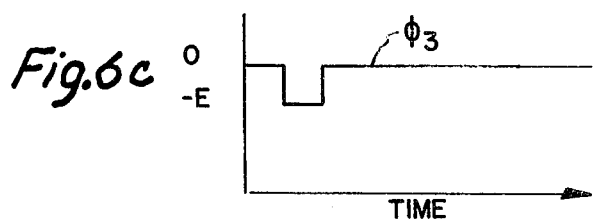

The operation of an analog-to-digital converter in accordance with the structure of FIG. 5 may be most easily understood by referring now to FIG. 6 wherein the several voltages applied to the terminals of the device of FIG. 5 are depicted in waveform diagrams as a function of time. FIGS. 6a through 6c illustrate the waveforms supplied to terminals $\phi 1$, $\phi 2$ and $\phi 3$, respectively. Voltages $V_a$ and $V_b$ are constant bias voltages which in conjunction with $\phi 1$ and $\phi 2$ create constant charge packets under electrode 115. As these charge packets are formed they are successively transferred into the charge storage location 138, the size of which will be recalled as proportional to the input signal level. It can be ssen, therefore, that the number of charge packets required to fill charge storage location 138 to a preselected level as measured at the output of source follower 140 is proportional to the amplitude of the input signal voltage. It is to be understood that the waveform illustrated in FIG. 6b is applied to a counter as was described in conjunction with FIG. 2 and that the inhibit and clear functions illustrated therein are also present although not illustrated in the embodiment of this invention of FIGS. 5 and 6. FIG. 6c illustrates the voltage applied to electrode 118 which, as will be recalled, eliminates all charge stored in charge storage location 138 from the previous measurement cycle.

This invention has been described in conjunction with several preferred embodiments thereof. It is to be understood that the invention itself is not limited to any particular structural embodiment, nor in fact to any particular technology, but rather relates to a conceptual method for obtaining a function useful in a wide range of applications. For example, one skilled in the art would recognize that an analog-to-digital converter in accordance with this invention could readily be constructed for use in conjunction with fluid circuits, the charge packets being replaced with metered fluid packets, and the charge storage locations being replaced with fluid reservoirs. Further, it will be appreciated by those skilled in the art that although this invention has been described in terms of a charge transfer implementation thereof, those skilled in the art will appreciate that other forms of devices are readily suited for the implementation of A/D conversion in accordance with this invention. For example, it is readily apparent that a bipolar structure could be constructed which is analogous to the structures illustrated, utilizing, for example, the type of circuit well known to those skilled in the art to construct bipolar bucket brigade delay lines, for example, as described in Sangster, F. L. J. and Teer, K., *Bucket-Brigade Electronics*, IEEE Journal of Solid State Circuits, 1969, Vol. SC-4, pp. 131-136.

It is to be understood that while several preferred embodiments of the invention have been described, and several more have been mentioned, that one skilled in the art will readily perceive various changes in form and detail which may be made without departing from the true spirit and scope of this invention, and that the appended claims are intended to include such changes.

What is claimed is:

1. A monolithic discrete-charge-packet transfer analog to digital converter comprising:

a semiconductor substrate having an insulative layer on at least a portion of a major surface thereof;

an electrode positioned on the insulative layer to form a region in the underlying substrate for storing and maintaining a quantity of electrical charge of a first polarity;

first means for filling said storing region to a preselected level of charge prior to each conversion of an analog signal;

second means selectively actuated after cessation of operation of said first means for directly connecting said analog signal to said electrode to remove charge of said first polarity from said storing region, the amount of charge removed being proportional to the instantaneous value of the analog signal when said second means is actuated;

third means enabled after operation of the second means for transferring a plurality of packets each containing essentially equal increments of electrical charge of said first polarity into said storing region;

means for counting each of said plurality of essentially equal increments; and means for detecting the presence of said preselected level of charge in said semiconductor storing region.

2. A method for converting an analog signal to a digital signal, comprising the steps of:

forming a region in a monolithic semiconductor member to provide a first electrical charge storage location;

establishing a first charge level in said first charge storage location prior to receiving said analog signal;

directly connecting said analog signal to said first charge storage location;

reducing said first charge level in said semiconductor region by an amount proportional to the value of said analog signal;

transferring each of a plurality of essentially constant size, metered charge packets to said first electrical charge storage location;

counting the total of said plurality of essentially constant size charge packets metered into said first electrical charge storage location;

continuously comparing, after the transfer of said plurality of metered charge packets has commenced, the level of charge in said first electrical charge storage location to said first charge level; and stopping said count and said transfer of metered charge packets into said depletion region when the level of charge in said charge storage location equals said first charge level by comparison, said count then being proportional to the value of said analog signal.

* * * * *